United States Patent
Kanbe

(10) Patent No.: US 6,522,358 B2
(45) Date of Patent: Feb. 18, 2003

(54) CHARGE TRANSFER DEVICE AND METHOD OF DRIVING THE CHARGE TRANSFER DEVICE

(75) Inventor: Hideo Kanbe, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/769,889

(22) Filed: Jan. 25, 2001

(65) Prior Publication Data

US 2001/0002847 A1 Jun. 7, 2001

Related U.S. Application Data

(62) Division of application No. 08/831,415, filed on Apr. 1, 1997, now Pat. No. 6,191,817.

(30) Foreign Application Priority Data

Apr. 2, 1996 (JP) .............................................. 8-104702

(51) Int. Cl.⁷ ................................................. H04N 3/14
(52) U.S. Cl. ...................... 348/296; 348/314; 348/299; 257/223; 257/233
(58) Field of Search ................................ 348/299, 296, 348/297, 314, 317, 319; 257/223, 222, 230, 233

(56) References Cited

U.S. PATENT DOCUMENTS

| | | | | | |
|---|---|---|---|---|---|
| 4,875,100 | A | * | 10/1989 | Yonemoto et al. | 348/296 |
| 4,977,584 | A | * | 12/1990 | Kohno et al. | 348/296 |
| 5,426,317 | A | * | 6/1995 | Hirota | 348/314 |
| 5,471,246 | A | * | 11/1995 | Nishima et al. | 348/296 |
| 5,532,743 | A | * | 7/1996 | Komobuchi | 348/297 |
| 5,578,842 | A | * | 11/1996 | Shinji | 257/223 |
| 5,729,287 | A | * | 3/1998 | Morimoto | 348/314 |
| 5,767,903 | A | * | 6/1998 | Kawamura et al. | 348/296 |
| 5,990,953 | A | * | 11/1999 | Nakashiba | 348/314 |
| RE36,812 | E | * | 8/2000 | Tani | 348/314 |

* cited by examiner

Primary Examiner—Wendy R. Garber
Assistant Examiner—Jacqueline Wilson
(74) Attorney, Agent, or Firm—Sonnenschein, Nath & Rosenthal

(57) ABSTRACT

A charge transfer device and a method of driving the charge transfer device are arranged to enable electric charge to be correctly transferred in a short time after starting. An initialization voltage is applied at the time of starting and a portion having a higher impurity concentration is formed below a channel.

4 Claims, 3 Drawing Sheets

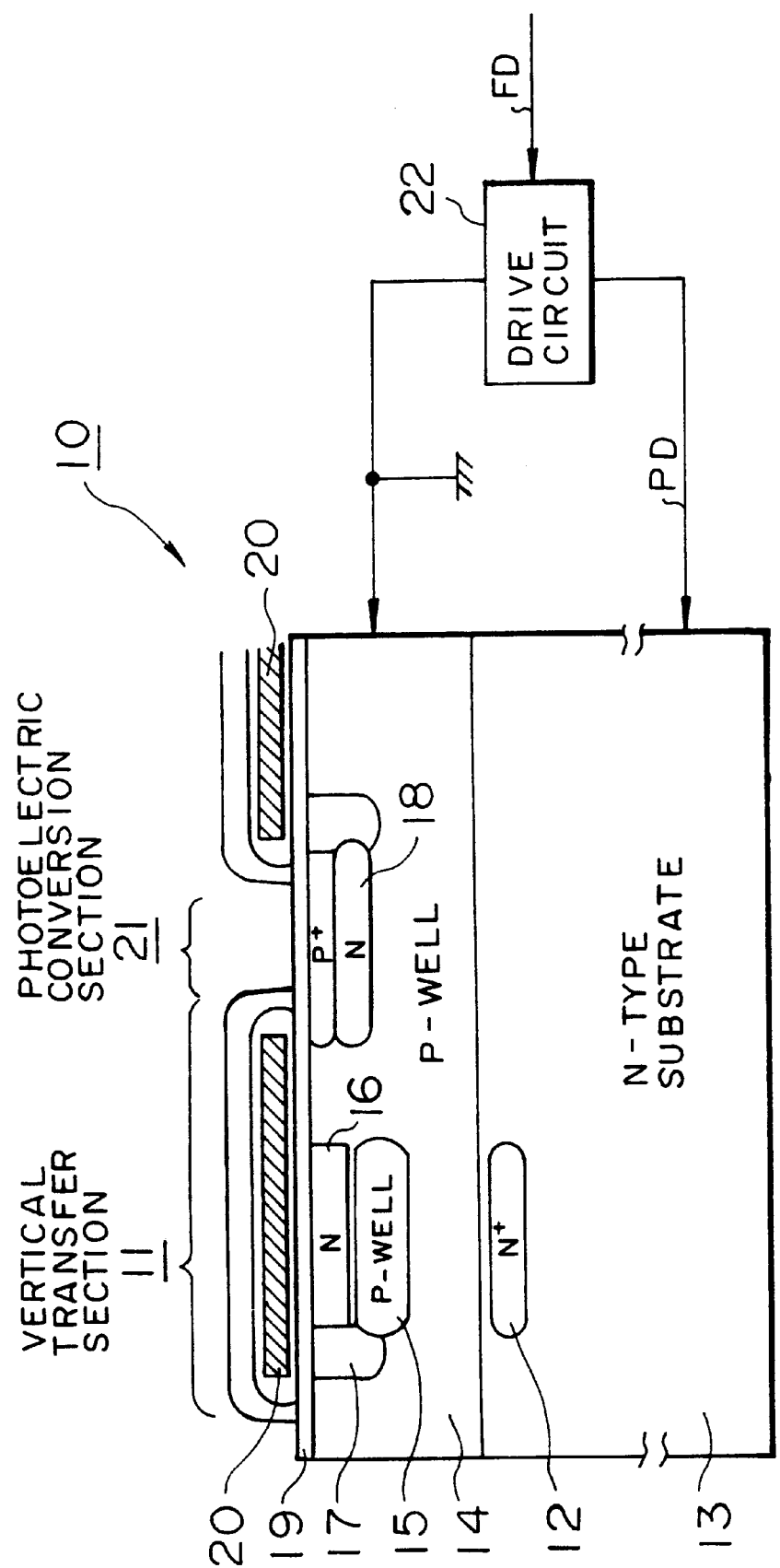

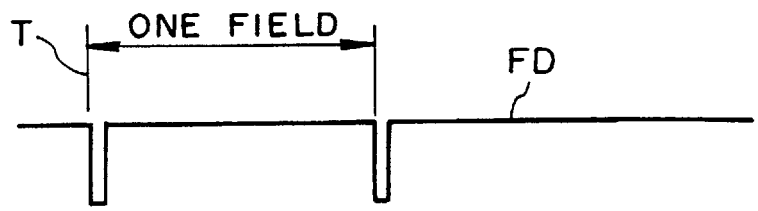
FIG. 2A
FIG. 2B
FIG. 3
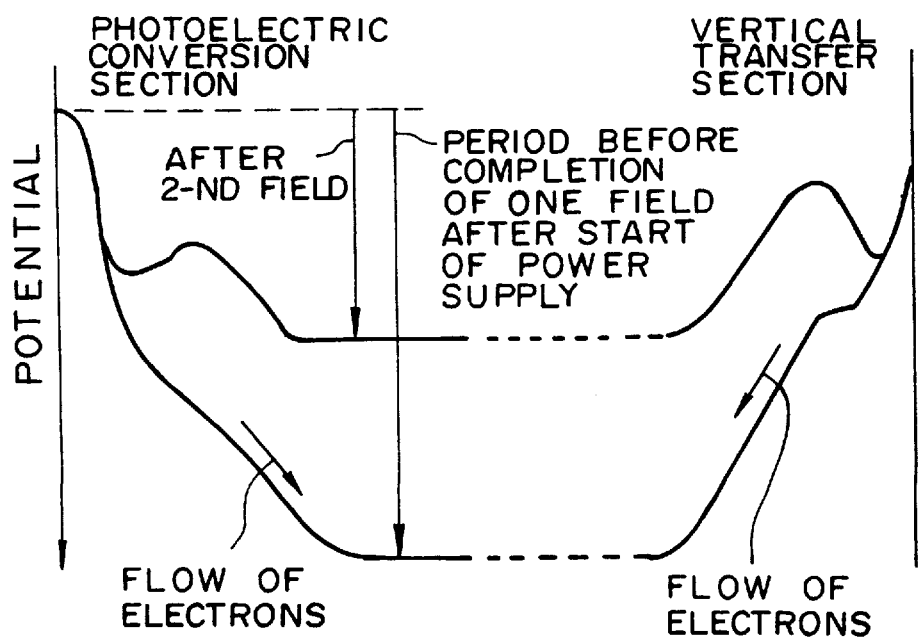

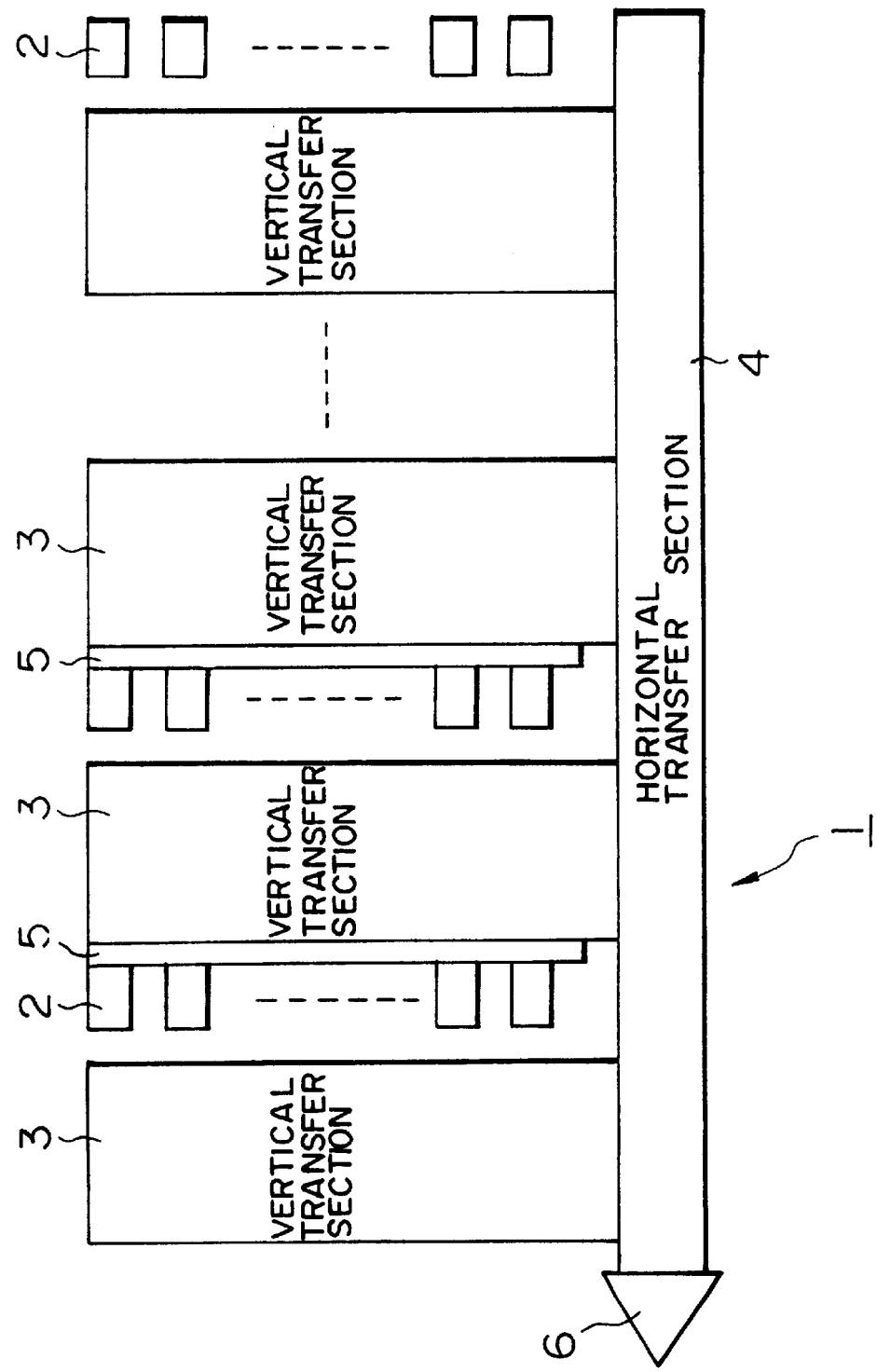

CHARGE TRANSFER DEVICE AND METHOD OF DRIVING THE CHARGE TRANSFER DEVICE

RELATED APPLICATION DATA

This patent is a divisional application of Ser. No. 08/831,415, filed on Apr. 1, 1997 now U.S. Pat. No. 6,191,817. Moreover, this patent claims priority to Japanese Application Mo. P08-104702, filed Apr. 2, 1996, which application is incorporated by reference to the extent permitted by law.

BACKGROUND OF THE INVENTION

1. Field of the Invention

The present invention relates to a charge transfer device and a method of driving the charge transfer device. For example, in an application of the present invention to a CCD solid image pickup device and an image pickup apparatus, an initialization voltage is applied at the time of starting or the impurity concentration in a region below each of channels of charge transfer sections is increased to quickly deplete the channels, thereby enabling correct transfer of electric charge in a short time after starting.

2. Description of the Related Art

Conventionally, a CCD solid image pickup device is arranged so that, in each of a horizontal charge transfer section and vertical charge transfer sections, potentials in a depleted channel are successively changed to transfer accumulated charge generated by photoelectric conversion sections.

FIG. 4 is a plan view of a CCD solid image pickup device of this kind. A CCD solid image pickup device 1 has photoelectric conversion sections 2 formed of photosensors and disposed in a matrix form, and also has vertical transfer sections 3 and a horizontal transfer section 4. The vertical transfer sections 3 are disposed between columns of the photoelectric conversion sections 2 arranged in the horizontal direction. The horizontal transfer section 4 is disposed at the lower end of the vertical transfer sections 3. Each photoelectric conversion section 2 accumulates charge by photoelectric conversion of incident light. Each vertical transfer section 3 reads out accumulated charge in each photoelectric conversion section 2 in a certain cycle and successively transfers the read-out accumulated charge to the horizontal transfer section 4. The horizontal transfer section 4 successively transfers to a charge detection section 6 the accumulated charge transferred from the vertical transfer sections 3. The charge detection section 6 converts the accumulated charge into an electrical signal and outputs the electrical signal transfer sections 3 and a horizontal transfer section 4. The vertical transfer sections 3 are disposed between columns of the photoelectric conversion sections 2 arranged in the horizontal direction. The horizontal transfer section 4 is disposed at the lower ends of the vertical transfer sections 3. Each photoelectric conversion section 2 accumulates charge by photoelectric conversion of incident light. Each vertical transfer section 3 reads out accumulated charge in each photoelectric conversion section 2 in a certain cycle and successively transfer the read-out accumulated charge to the horizontal transfer section 4. The horizontal transfer section 4 successively transfers to a charge detection section 6 the accumulated charge transferred from the vertical transfer sections 3. The charge detection section 6 converts the accumulated charge into an electrical signal and outputs the electrical signal.

The vertical transfer sections 3 and the horizontal transfer section 4 are formed in such a manner that transfer electrodes formed of polysilicon are arranged in an overlapping manner over channels of a semiconductor substrate formed by a predetermined process, with an insulating film interposed between the transfer electrodes and the substrate. In the vertical transfer sections 3 thus formed, four-phase drive pulses, for example, are applied to successively to change potentials below adjacent pairs of the electrodes so that accumulated charge is transferred. On the other hand, the horizontal transfer section 4 is formed so that the impurity concentration is changed in the channel below each of adjacent pairs of the electrodes, so that the adjacent pairs of the electrodes form electrode pairs. Two-phase drive pulses are applied to each adjacent electrode pair to successively transfer accumulated charge.

In a CCD solid image pickup device of this kind, the channels of the horizontal transfer section and the vertical transfer sections are full of charge when the operation is stopped. Therefore, it is difficult to output correct accumulated charge at the time of starting unless the channels are depleted by discharging the channels of the charge filling the channels. Ordinarily, this discharge is made by a reset drain of the charge detection section via the horizontal transfer section, as in the case of outputting accumulated charge.

In the conventional CCD solid image pickup device, therefore, a substantially long time, corresponding to several fields, is required for depletion of the channels immediately after a moment at which application of drive pulses is started by turning on power supply, and there is a problem of difficulty in enabling the device to correctly output accumulated charge in a short time after starting.

SUMMARY OF THE INVENTION

The present invention has been achieved in consideration of the above-described problem and an object of the present invention is to provide a charge transfer device capable of correctly outputting charge in a short time after starting and a method of driving the charge transfer device.

To achieve this object, according to the present invention, a region defined as a layer below a p-type region corresponding to a channel is formed so as to have a higher impurity concentration than other regions.

Also, an initialization voltage is applied between an n-type semiconductor substrate and the p-type region for a predetermined time period at the time of starting driving.

If a region defined as a layer below a p-type region corresponding to a channel is formed so as to have a higher impurity concentration than other regions, electric charge filling the channel can be discharged to the n-type semiconductor substrate more easily at this region than at other regions when a potential is changed by applying a voltage between the p-type region and the n-type semiconductor substrate. Correspondingly, the channel can be depleted in a shorter time.

If an initialization voltage is applied between the n-type semiconductor substrate and the p-type region for a predetermined time period at the time of starting driving, electric charge filling the channel can be discharged to the n-type semiconductor substrate, so that the channel can be depleted without transferring the charge.

BRIEF DESCRIPTION OF THE DRAWINGS

FIG. 1 is a cross-sectional view of a CCD solid image pickup device which represents an embodiment of the present invention;

FIG. 2 is a signal waveform diagram for explaining the operation of the CCD solid image pickup device shown in FIG. 1.

FIG. 3 is a characteristic curve diagram for explaining the operation of the CCD solid image pickup device shown in FIG. 1; and FIG. 4 is a plan view of a conventional CCD solid image pickup device.

DESCRIPTION OF THE PREFERRED EMBODIMENT

An embodiment of the present invention will be described in detail with reference to the accompanying drawings.

FIG. 1 is a cross-sectional view of a CCD solid image pickup device which represents an embodiment of the present invention. FIG. 1 is taken by cutting a vertical transfer section and a photoelectric conversion section. In the CCD solid image pickup device 10, a region 12 in which the impurity concentration is increased is formed as a layer below a channel of each of vertical transfer sections 11 to enable the image pickup device to output a correct image pickup result in a short time after starting.

The CCD solid image pickup device 10 has an n-type semiconductor substrate 13 containing an n-type impurity, e.g., phosphorous at $1 \times 10^{14}$ to $5 \times 10^{14}$ atm/cm$^3$. On the n-type semiconductor substrate 13 and below each of channel formation regions, a region 12 doped with the n-type impurity to have a higher impurity concentration of $1 \times 10^{15}$ to $5 \times 10^{20}$ atm/cm$^3$, preferably $1 \times 10^{17}$ to $5 \times 10^{18}$ atm/cm$^3$ is previously formed. A p-type well region 14 having a p-type impurity concentration of $1 \times 10^{15}$ to $1 \times 10^{16}$ atm is deposited on the n-type semiconductor substrate 13. This p-type well region 14 forms an overflow barrier. Further, in the CCD solid image pickup device 10, the p-type well region 14 is successively doped with impurities to form a high-concentration p-well region 15 and an n-type region 16 which form a channel of each vertical transfer section 11. A p$^+$ channel stop region 17 is formed adjacent to the channel of each vertical transfer section 11. In a horizontal transfer section, a region doped with the n-type impurity to have an increased impurity concentration is formed on the n-type semiconductor substrate 13 and below a channel formation region by the same process as that for the vertical transfer sections 11. Thereafter, a p-type well region and an n-type channel are formed. Preferably, the above-described region 12 having a higher density concentration is formed in such a position as to border on the n-type semiconductor substrate 13 and also to border on the interface between the n-type semiconductor substrate 13 and the p-type well region 14 or to be located in the vicinity of the interface.

In the CCD solid image pickup device 10, after subsequently forming an insulating film 19, first-layer electrodes 20 of the vertical transfer sections 11 and the horizontal transfer section are formed and second-layer electrodes of the vertical transfer sections 11 and the horizontal transfer section are formed with an insulating layer interposed therebetween. Further, in the CCD solid image pickup device 10, n-type charge accumulation portions 18 of photoelectric conversion sections 21 are formed by high-energy ion injection and a light shielding film or the like is thereafter formed.

In the CCD solid image pickup device 10 thus formed, a drive circuit 22 generates four-phase drive pulses for driving the vertical transfer sections 11 and two-phase drive pulses for driving the horizontal transfer section, or the like. That is, the drive circuit 22 forms various drive signals necessary for the operation of this CCD solid image pickup device 10 by receiving a horizontal sync signal, a vertical sync signal and a clock, or the like from a timing generator of an image pickup apparatus in which this CCD solid image pickup device 10 is incorporated.

At this time, as shown in FIG. 2, the drive circuit 22 applies, on the basis of a field pulse FD (FIG. 2A) which is a fall of a signal level falling in a cycle corresponding to one field, an initialization signal PD (FIG. 2B) having a largely rising signal level between the p-well region 14 and the n-type semiconductor substrate 13 for a predetermined time period shorter than the time period corresponding to one field from a time T at which outputting of drive pulses is started by turning on the power supply.

The signal level of initialization signal PD is set to a sufficiently high signal level compared with an electronic shutter drive pulse which is also applied between the p-well region 14 and the n-type semiconductor substrate 13. For example, a voltage of about 10 V is applied as a shutter voltage between the p-well region 14 and the n-type semiconductor substrate 13 at the time of electronic shuttering. At the time of initialization, a voltage higher than the shutter voltage, for example, 20 V is applied as initialization signal PD between the p-well region 14 and the n-type semiconductor substrate 13. When the shutter voltage is applied, a potential barrier exists in the p-well region 14 or 15 below each of the vertical transfer sections and the horizontal transfer section while a potential barrier of the p-well region 14 below each photoelectric conversion section 21 disappears, so that the charge accumulated in the n-type accumulation portions of the photoelectric conversion sections 21 are discharged to the n-type semiconductor substrate 13 through the p-well region 14.

When the power supply is turned on or a power saving mode or standby mode is canceled to start outputting drive pulses, initialization signal PD having a largely rising signal level is applied for the predetermined time period shorter than the period corresponding to one field. In the photoelectric conversion sections 21, surplus electrons existing at the pn junction are thereby discharged quickly to the n-type semiconductor substrate 13 at the time of starting, as shown in FIG. 3. The photoelectric conversion sections 21 are thereby depleted at the second field at latest after a moment at which the power supply is turned on. Thus, the photoelectric conversion sections 21 are set in such a state as to be able to output correct accumulated charge in a short time after a moment at which the power supply is turned on.

On the other hand, in the horizontal transfer section and the vertical transfer sections 11, when the power supply is turned on to start outputting drive pulses, initialization signal PD having a largely rising signal level is applied and the channel potential falls largely thereby, so that surplus charge is discharged to the n-type semiconductor substrate 13 through the p-well region 14. At this time, the high-impurity-concentration regions 12 formed in the n-type semiconductor substrate 13 promote discharge of surplus electrons in the horizontal transfer section and the vertical transfer sections 11 to set the horizontal transfer section and the vertical transfer sections 11 in a depleted state. Thus, the horizontal transfer section and the vertical transfer sections 11 are also set in such a state as to be able to output correct accumulated charge in a short time after a moment at which the power supply is turned on.

According to the above-described arrangement, initialization signal PD having a largely rising signal level (FIG. 2B) is applied between the p-well region 14 and the n-type semiconductor substrate 13 for a predetermined time period shorter than the time period corresponding to one field from the time when the power supply is turned on to start outputting drive pulses, thereby enabling the photoelectric conversion sections 21 and the channels of the vertical transfer sections 11 and the horizontal transfer section to be depleted in a short time. Consequently, a correct accumulated image pickup result can be output in a short time after a moment at which the power supply is turned on.

Also, the high-impurity-concentration regions 12 are formed as layers below the channels of the horizontal transfer section and the vertical transfer section 11 to promote discharge of surplus electrons when initialization signal PD is applied, thereby also achieving an effect of enabling a correct image pickup result to be output in a short time.

The embodiment of the present invention has been described with respect to the case in which high-impurity-concentration regions 12 are formed as layers below the channels of the horizontal transfer section and the vertical transfer section 11, and in which initialization signal PD is applied. The present invention, however, is not limited to this and the high-impurity-concentration regions 12 may be removed according to one's need. While the embodiment of the present invention has been described with respect to an interline transfer type CCD solid image pickup device, the present invention can also be applied to a frame transfer type CCD solid image pickup device, a full frame transfer type CCD solid image pickup device, an amplification type solid image pickup device, a CMOS solid image pickup device and the like.

According to the present invention, as described above, the channels of the charge transfer sections are quickly depleted by applying an initialization voltage at the time of starting or by increasing the impurity concentration in [a] regions below the channels of the charge transfer sections so that the channels are immediately depleted, thereby enabling electric charge to be correctly transferred in a short time after starting.

What is claimed is:

1. A solid image pickup apparatus comprising:
   a substrate of a first conduction type;
   a semiconductor layer of a second conduction type provided on said substrate;
   a charge accumulation region provided on said second conduction type layer to accumulate signal charge generated by photoelectric conversion;
   a charge transfer region provided on said second conduction type layer to transfer charge accumulated in said charge accumulation region;
   a first conduction type region formed below said charge transfer region so as to border on said substrate, said first conduction type region having an impurity concentration higher than an impurity concentration in said substrate; and
   initialization means for discharging unnecessary charge accumulated in said charge accumulation region and in said charge transfer region in response to an initialization signal.

2. The solid image pickup apparatus according to claim 1, wherein said semiconductor substrate has a first conduction type impurity concentration of $1 \times 10^{14}$ to $5 \times 10^{14}$ atm/cm$^3$, and said first conduction type impurity concentration than said substrate which is $1 \times 10^{15}$ to $5 \times 10^{20}$ atm/cm$^3$.

3. The solid image pickup apparatus according to claim 2, wherein said first conduction type region has a higher first conduction type impurity concentration than said substrate which is $1 \times 10^{17}$ to $5 \times 10^{18}$ atm/cm$^3$.

4. A solid image pickup apparatus comprising:
   a semiconductor substrate of a first conduction type;
   an overflow barrier region provided on said semiconductor substrate;
   charge transfer means formed above said overflow barrier region to transfer signal charge generated in said photoelectric conversion section;
   means for discharging unnecessary charge accumulated in said charge transfer means to said semiconductor substrate in response to an initialization signal; and
   a first conduction type semiconductor region formed at a position corresponding to said charge transfer means so as to border on said semiconductor substrate, said first conduction type semiconductor region having a higher impurity concentration than said semiconductor substrate.

* * * * *